(12) United States Patent
Yamanishi et al.

(10) Patent No.: US 8,374,208 B2
(45) Date of Patent: *Feb. 12, 2013

(54) QUANTUM CASCADE LASER

(75) Inventors: Masamichi Yamanishi, Hamamatsu (JP); Kazuue Fujita, Hamamatsu (JP); Tadataka Edamura, Hamamatsu (JP); Naota Akikusa, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 59 days.

This patent is subject to a terminal disclaimer.

(21) Appl. No.: 12/919,289

(22) PCT Filed: Feb. 24, 2009

(86) PCT No.: PCT/JP2009/053286
§ 371 (c)(1),
(2), (4) Date: Aug. 25, 2010

(87) PCT Pub. No.: WO2009/107609
PCT Pub. Date: Sep. 3, 2009

(65) Prior Publication Data
US 2011/0007768 A1    Jan. 13, 2011

(30) Foreign Application Priority Data
Feb. 28, 2008   (JP) ................... 2008-048060

(51) Int. Cl.
*H01S 5/00*   (2006.01)
(52) U.S. Cl. .................................. 372/45.01
(58) Field of Classification Search ............ 257/22, 257/13; 372/46.01, 46.012; 438/357
See application file for complete search history.

(56) References Cited

U.S. PATENT DOCUMENTS 5,457,709 A * 10/1995 Capasso et al. ............ 372/45.01
(Continued)

FOREIGN PATENT DOCUMENTS

JP    8-279647 A    10/1996
JP    10-004242 A    1/1998
(Continued)

OTHER PUBLICATIONS

M. Beck, et al., "Continuous Wave Operation of a Mid-Infrared Semiconductor Laser at Room Temperature," Science, vol. 295, 2002, pp. 301-305.
(Continued)

*Primary Examiner* — Yuanda Zhang
*Assistant Examiner* — Tuan Nguyen
(74) *Attorney, Agent, or Firm* — Drinker Biddle & Reath LLP

(57) ABSTRACT

A quantum cascade laser is configured so as to include a semiconductor substrate and an active layer which is provided on the substrate and has a cascade structure including multistage-laminated unit laminate structures each including a quantum well emission layer and an injection layer. Moreover, the unit laminate structure has, in its subband level structure, an emission upper level, a lower level, and an injection level 4 of higher energy than the upper level, and light hv is generated by intersubband transition of electrons from the level to the level in the emission layer, and electrons after emission transition are injected into the injection level 4 of the subsequent stage via the injection layer. In addition, the emission layer includes two or more well layers, and the first well layer closest to the injection layer of the preceding stage is used as a well layer for injection level formation.

9 Claims, 6 Drawing Sheets

U.S. PATENT DOCUMENTS

| | | | |
|---|---|---|---|
| 5,509,025 | A | 4/1996 | Capasso et al. |
| 5,745,516 | A | 4/1998 | Capasso et al. |
| 6,751,244 | B2 | 6/2004 | Faist et al. |
| 6,922,427 | B2 | 7/2005 | Faist et al. |
| 8,068,528 | B2 * | 11/2011 | Edamura et al. ........... 372/45.01 |
| 2011/0286486 | A1 | 11/2011 | Fujita et al. |

FOREIGN PATENT DOCUMENTS

| | | |
|---|---|---|
| JP | 2004-119814 A | 4/2004 |
| JP | 2006-032691 A | 2/2006 |
| JP | 2008-010733 | 1/2008 |
| JP | 2008-060396 | 3/2008 |
| JP | 2008-177366 | 7/2008 |

OTHER PUBLICATIONS

J.S. Yu, et al., "High-Power Continuous-Wave Operation of a 6 μm Quantum-Cascade Laser at Room Temperature," Applied Physics Letters, vol. 83, 2003, pp. 2503-2505.

A.Evans et al., "Continuous-Wave Operation of λ~4.8 μm Quantum-Cascade Lasers at Room Temperature," Applied Physics Letters, vol. 85, 2004, pp. 2166-2168.

U.S. Office Action dated Mar. 14, 2012 that issued in U.S. Appl. No. 13/110,687 including Double Patenting Rejections on pp. 3-5.

Alessandro Tredicucci et al., "A multiwavelength semiconductor laser," Nature, Nov. 26, 1998, pp. 350-353, vol. 396.

A. Wittmann et al., "Heterogeneous High-Performance Quantum-Cascade Laser Sources for Broad-Band Tuning," IEEE Journal of Quantum Electronics, Nov. 2008, pp. 1083-1088, vol. 44, No. 11.

Andreas Wittman et al., "High-Performance Bound-to-Continuum Quantum-Cascade Lasers for Broad-Gain Applications," IEEE Journal of Quantum Electronics, Jan. 2008, pp. 36-40, vol. 44, No. 1.

Richard Maulini et al, "Broadband tuning of external cavity bound-to-continuum quantum-cascade lasers," Applied Physics Letters, 2004, pp. 1659-1661, vol. 84, No. 10.

A. Wittmann, et al., Intersubband linewidths in quantum cascade laser designs, Applied Physics Letters, 2008, pp. 141103-1-141103-3, vol. 93.

* cited by examiner

Fig.5

| SEMICONDUCTOR LAYER | | COMPOSITION | LAYER THICKNESS (nm) | | DOPING |
|---|---|---|---|---|---|
| | | | BARRIER LAYER | WELL LAYER | |
| INJECTION BARRIER LAYER 171 | | InAlAs | 4.5 | | undoped |
| EMISSION LAYER 17 | WELL LAYER 161 | InGaAs | | 2.4 | undoped |
| | BARRIER LAYER 172 | InAlAs | 2.1 | | undoped |
| | 162 | InGaAs | | 6.9 | undoped |
| | 173 | InAlAs | 1.0 | | undoped |
| | 163 | InGaAs | | 6.0 | undoped |
| | 174 | InAlAs | 1.7 | | undoped |
| | 164 | InGaAs | | 4.6 | undoped |
| EXIT BARRIER LAYER 191 | | InAlAs | 2.1 | | undoped |
| INJECTION LAYER 18 | WELL LAYER 181 | InGaAs | | 4.0 | undoped |
| | BARRIER LAYER 192 | InAlAs | 2.0 | | undoped |
| | 182 | InGaAs | | 3.7 | undoped |
| | 193 | InAlAs | 2.2 | | undoped |
| | 183 | InGaAs | | 3.4 | undoped |
| | 194 | InAlAs | 2.4 | | Si doped:$3\times10^{17}$/cm$^3$ |
| | 184 | InGaAs | | 3.1 | Si doped:$3\times10^{17}$/cm$^3$ |
| | 195 | InAlAs | 3.0 | | Si doped:$3\times10^{17}$/cm$^3$ |
| | 185 | InGaAs | | 2.9 | Si doped:$3\times10^{17}$/cm$^3$ |
| | 196 | InAlAs | 3.3 | | undoped |
| | 186 | InGaAs | | 2.7 | undoped |
| | 197 | InAlAs | 3.5 | | undoped |
| | 187 | InGaAs | | 2.5 | undoped |

QUANTUM CASCADE LASER

TECHNICAL FIELD

The present invention relates to a quantum cascade laser using intersubband transition in a quantum well structure.

BACKGROUND ART

Light in a mid-infrared wavelength region (for example, a wavelength of 5 to 30 μm) is a wavelength region important in the field of spectroscopic analysis. As a high-performance and compact semiconductor light source in this wavelength region, in recent years, quantum cascade lasers (QCL) have gained attention (for example, refer to Patent Documents 1 to 6 and Non-Patent Documents 1 to 3).

A quantum cascade laser is a monopolar type laser element which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers, Patent Document 1: Japanese Patent Application Laid-Open No. H8-279647
Patent Document 2: Japanese Patent Application Laid-Open No. 2006-032691
Patent Document 3: Japanese Patent Application Laid-Open No. 2004-119814
Patent Document 4: U.S. Pat. No. 5,457,709
Patent Document 5: U.S. Pat. No. 5,509,025
Patent Document 6: Japanese Patent Application Laid-Open No. H10-4242
Non-Patent Document 1: M. Beck et al., "Continuous Wave Operation of a Mid-Infrared Semiconductor Laser at Room Temperature," Science Vol. 295 (2002) pp. 301-305
Non-Patent Document 2: J. S. Yu et al., "High-power continuous-wave operation of a 6 μm quantum-cascade laser at room temperature," Appl. Phys. Lett. Vol. 83 (2003) pp. 2503-2505
Non-Patent Document 3: A. Evans et al., "Continuous-wave operation of λ~4.8 μm quantum-cascade lasers at room temperature," Appl. Phys. Lett. Vol. 85 (2004) pp. 2166-2168

DISCLOSURE OF THE INVENTION

Problems to be Solved by the Invention

The performance of quantum cascade lasers has rapidly improved in recent years, and after the success (Non-Patent Document 1) of continuous oscillation (CW operation) at room temperature with a wavelength of 9.1 μm made by M. Beck et al. in 2002, continuous operation at room temperature has been realized at present in a wavelength region of 3.8 to 10 μm. As an example of such continuous operation at room temperature, the group of M. Razeghi et al. reported operation at oscillation wavelengths of 6 μm and 4.8 μm (Non-Patent Documents 2 and 3).

Here, for realizing continuous operation of a quantum cascade laser under operation conditions of high temperatures not less than room temperature, a lower threshold of laser operation by means of efficient formation of a population inversion is necessary. However, under the present circumstances, it cannot be said that sufficient performance is obtained in laser operation such as operation at room temperature of a quantum cascade laser.

The present invention has been made in order to solve the above-described problems, and an object thereof is to provide a quantum cascade laser capable of realizing operation with high efficiency at high temperature.

Means for Solving the Problems

Regarding the problem described above, the inventors of the present application considered a subband level structure in a quantum cascade laser in detail. As a result, the inventors found that in a quantum cascade laser with a conventional structure, it was difficult to efficiently inject electrons from a level in an injection layer of a preceding stage into an emission upper level in an emission layer in a level structure of an active layer, and this was one of the causes limiting the laser performance, and then conceived the present invention.

That is, a quantum cascade laser of the present invention includes: (1) a semiconductor substrate, and (2) an active layer which is provided on the semiconductor substrate and has a cascade structure formed by alternately laminating quantum well emission layers and injection layers by multistage-laminating unit laminate structures each including the quantum well emission layer and the injection layer, wherein (3) each of the plurality of unit laminate structures included in the active layer has an emission upper level, an emission lower level, and an injection level as an energy level higher than the emission upper level in its subband level structure, (4) light is generated by intersubband transition of electrons from the emission upper level into the emission lower level in the quantum well emission layer, and electrons after the intersubband transition are injected into the injection level in the unit laminate structure of the subsequent stage via the injection layer, and (5) the quantum well emission layer includes n (n is an integer of 2 or more) well layers, and a first well layer closest to the injection layer side of the preceding stage is formed as a well layer for formation of the injection level.

In the quantum cascade layer described above, in the subband level structure of the unit laminate structure consisting of the emission layer and the injection layer, in addition to the emission upper level and the emission lower level relating to emission, the injection level as an energy level higher than the upper level is provided. Then, electrons from the unit laminate structure of the preceding stage are not directly injected into the upper level but are injected into the injection level and then relaxed and supplied to the upper level. Accordingly, supply efficiency of electrons into the emission upper level can be improved.

Further, in this configuration, the emission layer is provided with a quantum well structure including two or more well layers, and the injection level is formed in a first well layer which is closest to the preceding stage side and adjacent to an injection barrier layer. Accordingly, the injection level to be used for electron injection and the upper level and the lower level relating to emission can be preferably separated in the emission layer. With the above-described configuration, a population inversion can be efficiently formed between the emission upper level and the lower level, and operation of a quantum cascade laser with high efficiency at high temperature can be realized. Moreover, the above-described subband level structure can be controlled by the design of the quantum well structure in the unit laminate structure constituting the active layer. In addition, n well layers included in the emission layer are preferably three or more.

Effects of the Invention

According to the quantum cascade laser of the present invention, in the subband level structure of the unit laminate structure of the active layer, the injection level is provided in addition to the emission upper level and the emission lower level so that electrons from the unit laminate structure of the preceding stage are injected into the injection level and then supplied to the upper level, and in the emission layer including two or more well layers, the first well layer closest to the preceding stage side is used as a well layer for injection level formation, and accordingly, a population inversion can be efficiently formed between the upper level and the lower level, and operation of the quantum cascade laser with high efficiency at high temperatures can be realized.

BRIEF DESCRIPTION OF THE DRAWINGS

FIG. 5 is a chart showing an example of a structure of a unit laminate structure of one period in the active layer.

Figure 1:
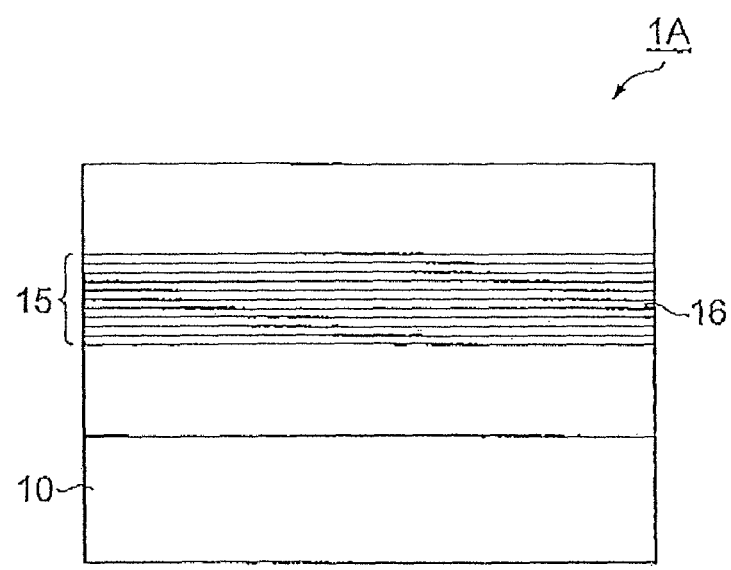
FIG. 1 is a view schematically showing a basic configuration of a quantum cascade laser.

DESCRIPTION OF THE SYMBOLS 1A, 1B—Quantum cascade laser, 10, 50—Semiconductor substrate, 15, 55—Active layer, 16, 56—Unit laminate structure, 17—Quantum well emission layer, 18—Injection layer, 51—Lower core layer, 52—Upper core layer, 53—Cladding layer, 54—Contact layer.

BEST MODE FOR CARRYING OUT THE INVENTION

Hereinafter, a preferred embodiment of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a view schematically showing a basic configuration of a quantum cascade laser according to the present invention. A quantum cascade laser 1A of the present embodiment is a monopolar type laser element which generates light by using intersubband electron transition in a semiconductor quantum well structure. This quantum cascade laser 1A includes a semiconductor substrate 10 and an active layer 15 formed on the semiconductor substrate 10. Moreover, on predetermined two surfaces opposed to each other of the side surfaces of the quantum cascade laser 1A, mirror surfaces (not shown) constituting an optical resonator are formed.

The active layer 15 has a cascade structure formed by alternately multistage-laminating quantum well emission layers to be used for generating light and injection layers to be used for injecting electrons into the emission layers. In detail, a semiconductor lamination structure consisting of an emission layer and an injection layer is defined as a unit laminate structure 16 of one period, and by multistage-laminating the unit laminate structures 16, the active layer 15 is formed. The number of laminations of the unit laminate structures 16 each including the emission layer and the injection layer is properly set and is, for example, approximately several hundred. The active layer 15 is formed on the semiconductor substrate 10 directly or via another semiconductor layer.

Figure 2:
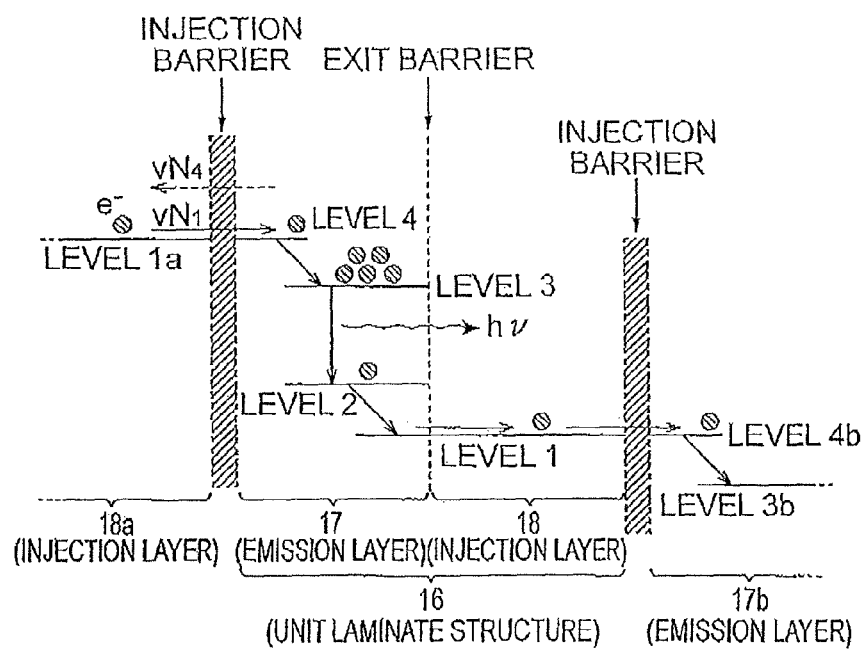
FIG. 2 is a diagram showing a subband level structure in an active layer of the quantum cascade laser shown in FIG. 1.

FIG. 2 is a diagram showing a subband level structure in the active layer of the quantum cascade laser shown in FIG. 1. As shown in FIG. 2, each of the plurality of unit laminate structures 16 included in the active layer 15 consists of the quantum well emission layer 17 and the injection layer 18. The emission layer 17 and the injection layer 18 are respectively formed so as to have a predetermined quantum well structure including quantum well layers and quantum barrier layers as described later. Accordingly, in the unit laminate structure 16, a subband level structure as an energy level structure formed by the quantum well structure is formed.

As shown in FIG. 2, the unit laminate structure 16 has, in its subband level structure, in addition to an emission upper level (level 3) and an emission lower level (level 2) relating to emission by means of intersubband transition, an injection level (level 4) as an energy level higher than the upper level 3. This injection level 4 is set so that the energy difference between the injection level 4 and the upper level 3 becomes energy of an LO (Longitudinal Optical) phonon.

$$E_{LO} = \hbar \omega_{LO} \quad \text{[Equation 1]}$$

This energy $E_{LO}$ is, for example, $E_{LO}$=36 meV when the semiconductor material is GaAs, and $E_{LO}$=34 meV when the semiconductor material is InGaAs.

In the present embodiment, the emission layer 17 includes n (n is an integer of 2 or more, preferably 3 or more) well layers, and a first well layer at a position closest to the injection layer 18a side of the preceding stage serves as a well layer for formation of the injection level. Accordingly, as schematically shown in FIG. 2, the injection level 4 is formed in the region on the injection layer 18a side of the preceding stage including the first well layer in the emission layer 17. Moreover, with respect to this injection level 4, the upper level 3 and the lower level 2 are preferably formed in the region on the injection layer 18 side of the same stage in the emission layer 17. Accordingly, the injection level 4 is spatially separated from the upper level 3 and the lower level 2 inside the emission layer 17.

The unit laminate structure 16 shown in FIG. 2 has a relaxation level 1 as an energy level lower than the lower level 2 in its subband level structure. Moreover, this relaxation level 1 is set, similar to the injection level 4 described above, so that the energy difference between the lower level 2 and the relaxation level 1 becomes LO phonon energy $E_{LO}$. In this case, in the level structure shown in FIG. 2, the energy interval between the level 4 and the level 3 and the energy interval between the level 2 and the level 1 are set to be equal to each other. Moreover, the injection level 4 is set so as to substantially coincide with a predetermined level (for example, relaxation level) 1a in the injection layer 18a of the unit laminate structure of the preceding stage.

In this subband level structure, electrons e⁻ from the level 1a in the injection layer 18a of the preceding stage are injected into the injection level 4 in the quantum well emission layer 17 due to a resonant tunneling effect via an injection barrier. Moreover, electrons injected into the injection level 4 are supplied at a high speed to the upper level 3 by means of LO phonon scattering (longitudinal optical phonon scattering). Furthermore, electrons supplied to the upper level 3 emission-transit to the lower level 2, and at this time, light hv of a wavelength corresponding to the energy difference between subband levels of the level 3 and the level 2 is generated. Moreover, the electrons transited to the lower level 2 are relaxed and extracted at a high speed to the relaxation level 1 by means of LO phonon scattering. Accordingly, a population inversion for realizing laser oscillation between the upper level 3 and the lower level 2 is formed.

The electrons relaxed to the relaxation level 1 are injected into the injection level 4b in the emission layer 17b of the subsequent stage via an exit barrier and the injection layer 18. These injection, relaxation, and emission transition of electrons are repeated in the plurality of unit laminate structures 16 constituting the active layer 15, whereby light generation occurs in a cascade manner in the active layer 15. That is, by alternately laminating many emission layers 17 and injection layers 18, the electrons successively move through the laminate structures 16 in a cascade manner, and light hv is generated at the time of the intersubband transition in each laminate structure. Moreover, such light is resonated by the optical resonator of the laser 1A, whereby a laser beam with a predetermined wavelength is generated.

The effects of the quantum cascade laser 1A of the present embodiment will be described.

In the laser 1A shown in FIG. 1 and FIG. 2, in the subband level structure of the unit laminate structure 16 consisting of the emission layer 17 and the injection layer 18, in addition to the upper level 3 and the lower level 2 relating to emission, the injection level 4 is provided as an energy level higher than the upper level 3. Then, electrons from the unit laminate structure of the preceding stage are not directly injected into the emission upper level 3 but are injected into the injection level 4 and then relaxed and supplied to the upper level 3. Thereby, the supply efficiency of electrons to the emission upper level 3 can be improved.

Further, in this configuration, of two or more well layers constituting the emission layer 17, in the first well layer closest to the injection layer 18a side of the preceding stage and adjacent to the injection barrier layer, the injection level 4 is formed. Accordingly, the injection level 4 to be used for electron injection can be preferably separated from the upper level 3 and the lower level 2 relating to emission in the emission layer 17. With the above-described configuration, an inverted population can be efficiently formed between the emission upper level 3 and the lower level 2, and high efficiency operation at high temperature of the quantum cascade laser 1A can be realized.

Such a subband level structure can be controlled by the design of the quantum well structure in the unit laminate structure constituting the active layer as described later along with a detailed configuration example. In the quantum well structure of the emission layer 17, the number of well layers included in the emission layer 17 is preferably set to be not less than 3. Thus, by forming the emission layer 17 including n (n is an integer of 3 or more) well layers, the injection level 4 positioned on the preceding stage side can be preferably spatially separated from the upper level 3 and the lower level 2 relating to emission.

Figure 3:
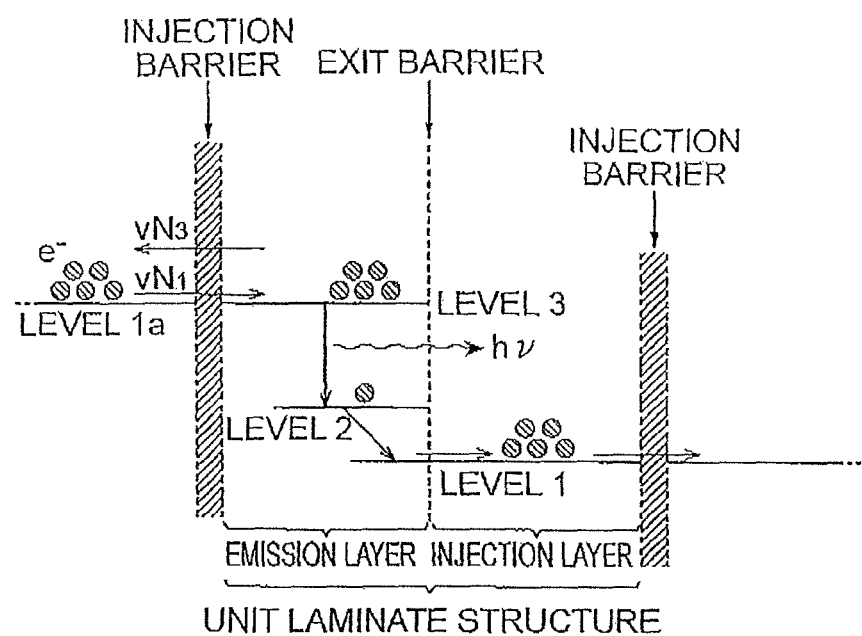
FIG. 3 is a diagram showing a subband level structure in an active layer of a conventional quantum cascade laser.

The laser performance improvement effect due to the above-described subband level structure will be described in detail while comparing it with a conventional structure. FIG. 3 is a diagram showing a subband level structure in an active layer of a conventional quantum cascade laser. As shown in FIG. 3, the unit laminate structure constituting the active layer in the conventional structure has an emission upper level 3, an emission lower level 2, and a relaxation level 1 in its subband level structure. Moreover, in this structure, the upper level 3 is set so as to substantially coincide with a predetermined level 1a in the injection layer of the unit laminate structure of the preceding stage.

In this level structure, electrons from the level 1a in the injection layer of the preceding stage are injected into the upper level 3 due to a resonant tunneling effect via an injection barrier. Then, the electrons supplied to the upper level 3 emission-transit to the lower level 2, and are relaxed at a high speed to the relaxation level 1 by means of LO phonon scattering. Moreover, when an electric field is further added to the quantum cascade laser and finally the level 1a in the injection layer of the preceding stage and the level 3 in the emission layer do not coincide with each other, the resonant tunneling is quenched and the laser operation stops. Thus, during operation, the level 1a and the level 3 are always directly coupled to each other. This level structure becomes a cause limiting the laser performance.

Specifically, the electron injection layer is normally subjected to doping for supplying a current to the emission layer in the next period and electrons relaxed from the emission layer are accumulated, and the electron injection layer is in a state like a kind of heat reservoir. In the state where the level 1a of this injection layer and the emission upper level 3 are directly coupled to each other, an increase in gain width due to an increase in influence of electron-electron scattering in the upper level, an increase in oscillation threshold due to an increase in scattering rate in the upper level, and pullback of current to the level 1a of the injection layer from the emission upper level 3, etc., occur, and these deteriorate the laser performance.

When pullback of current from the upper level 3 in the emission layer to the injection layer occurs, a maximum current from the injection layer to the emission upper level 3 is greatly limited, and this greatly influences the laser performance. In detail, in order to obtain laser operation, it is required that electrons are supplied from the injection layer and electrons are always accumulated in the upper level 3. Here, in the following description, the number of electrons existing at the level x will be expressed as $N_x$.

In the level structure of FIG. 3, assuming that electrons e move at an injection speed v according to tunnel injection, the current from the level 1a (level 1 of the preceding stage) of the injection layer to the emission upper level 3 is $evN_1$. On the other hand, in the state where the level 1a and the upper level 3 are directly coupled, a reverse current $evN_3$ caused by pullback of electrons reverse to the level 1a from the upper level 3 flows. Therefore, an effective current from the level 1a in the injection layer to the emission upper level 3 is $ev(N_1-N_3)$.

As is understood from this current amount, the number of electrons $N_3$ in the upper level 3 is not more than the number of electrons $N_1$ in the level 1a, and the number of electrons of the upper level 3 which applies a maximum current during laser operation is $N_3=N_1$. Moreover, electrons which transited or relaxed from the emission upper level 3 to the lower level 2 are extracted at a high speed from the lower level 2 to the level 1 of the next injection layer, so that the number of electrons of the emission lower level 2 during laser operation is $N_2=0$.

Here, considering that the doping concentration in the unit laminate structure defined as $N_S$ satisfies $N_S=N_1+N_2+N_3$, finally, the maximum number of electrons $N_3$ capable of existing at the emission upper level 3 is expressed as follows, $$N_{3max}=N_S/2$$

That is, the number of electrons contributing to oscillation during laser operation is limited to be not more than half of the number of electrons $N_S$ doped in the electron injection layer. Moreover, in this structure, electrons half or more of the doping concentration are accumulated in the injection layer, so that waveguide loss increases due to free carrier absorption or intersubband absorption.

On the other hand, in the level structure of FIG. 2 in which the injection level 4 of the energy higher than the emission upper level 3 is provided, a current according to tunnel injection from the level 1a in the injection layer 18a of the preceding stage to the level 4 in the emission layer 17 becomes $evN_1$ as in the case of the structure of FIG. 3. Moreover, electrons injected into the injection level 4 are supplied at a high speed to the emission upper level 3 in subpicoseconds by LO phonon scattering. Therefore, the electrons are not accumulated in the level 4, and the reverse current $evN_4$ from the injection level 4 to the level 1a of the injection layer 18a becomes very small. Further, the injection level 4, and the upper level 3 are energetically distant from each other, so that few electrons return to the level 4 from the level 3. Therefore, the number of electrons of the level 1a and the level 4 during laser operation can be regarded as $N_1=N_4=0$.

Next, relaxation from the emission upper level 3 to the lower level 2 is also mainly caused by LO phonon scattering, however, the energy interval between the levels is large, so that the relaxation speed is relatively slow, and the scattering time is, for example, approximately several picoseconds. Moreover, emission transition from the upper level 3 to the lower level 2 is approximately in several tens of nanoseconds in the case of spontaneous emission, and is slower than or at the same speed as LO phonon scattering in the case of induced emission. Therefore, during laser operation, electrons are accumulated in the upper level 3.

By thus using the level structure of FIG. 2, in the unit laminate structure 16, conditions for making the electron relaxation time $\tau_{43}$ from the injection level 4 to the upper level 3 sufficiently shorter than the electron relaxation time $\tau_{32}$ from the upper level 3 to the lower level 2 can be preferably realized. Accordingly, as described above, during laser operation, electrons can be preferably accumulated in the emission upper level 3.

Electrons which transited or relaxed from the emission upper level 3 to the lower level 2 are extracted at a high speed in subpicoseconds from the lower level 2 to the level 1 due to LO phonon scattering or relaxation in a miniband, etc., so that the number of electrons in the emission lower level 2 during laser operation becomes $N_2=0$. Here, considering that the doping concentration in the unit laminate structure 16 defined as $N_S$ satisfies $N_S=N_1+N_2+N_3+N_4$, finally, the maximum number of electrons $N_3$ capable of existing at the emission upper level 3 is expressed as follows.

$$N_{3max}=N_S$$

That is, in the subband level structure shown in FIG. 2, the influence of direct coupling between the level 1a of the injection layer and the emission upper level 3 which limits the laser performance in the conventional structure of FIG. 3 is eliminated, and all of the electrons doped in the electron injection layer can be used up for oscillation during laser operation. Moreover, by using up the electrons inside the injection layer, an increase in waveguide loss due to free carrier absorption and intersubband absorption is reduced. Therefore, by using the level structure of FIG. 2, a lower threshold of laser operation than in the conventional structure is realized, the dynamic range is improved, and the laser performance can be remarkably improved.

In the conventional structure shown in FIG. 3, electrons from the level 1a in the injection layer of the preceding stage may be injected not only into the upper level 3 but also into the lower level 2. On the other hand, in the level structure shown in FIG. 2, the first well layer closest to the injection layer 18a side of the preceding stage in the emission layer 17 is used as a well layer for forming the injection level 4, and the injection level 4 is spatially separated from the emission upper level 3 and the lower level 2 in the emission layer 17. With this configuration, electrons injected into the level 4 are hardly scattered to the spatially separated lower level 2, and are selectively supplied at a high speed to the upper level 3.

Thus, by using the level structure of FIG. 2, in the unit laminate structure 16, conditions for making the electron relaxation time $\tau_{43}$ from the injection level 4 to the upper level 3 sufficiently shorter than the electron relaxation time $\tau_{42}$ from the injection level 4 to the lower level 2 can be preferably realized. Alternatively, further, conditions for making the electron relaxation time $\tau_{43}$ from the injection level 4 to the upper level 3 sufficiently shorter than the electron relaxation time $\tau_{4low}$ from the injection level 4 to all levels (including the lower level 2) lower than the upper level 3 can be preferably realized. Accordingly, an effective population inversion can be formed between the upper level 3 and the lower level 2 with high efficiency. Moreover, such setting of the relaxation times $\tau$ is preferably realized by the configuration in which the injection level 4 is localized on the preceding stage side in the emission layer 17 as described above.

In detail, the relaxation time $\tau_{4low}$ from the injection level 4 to all of the levels lower than the upper level 3 is, for example, at least several picoseconds or more. On the other hand, the relaxation time $\tau_{43}$ from the injection level 4 to the upper level 3 can be shortened to be, for example, not more than 0.3 picoseconds by using LO phonon scattering, etc. Therefore, the condition of $\tau_{43} \ll \tau_{4low}$ important for improving the injection efficiency can be easily designed and realized.

The configuration in which the injection level 4 is spatially separated from the upper level 3 and the lower level 2 is also effective for reliably avoiding direct coupling between the emission upper level 3 and the level 1a in the injection layer 18a. Moreover, even if electrons which directly relax from the injection level 4 to the lower level 2 or the level 1, etc., exist, the above-described condition for using up all of the electrodes doped in the electron injection layer for oscillation during laser operation is satisfied. That is, when electrons in the injection level 4 directly relax to the level 2 or 1, etc., the electrons are supplied at a high speed to the emission upper level 3b via the injection level 4b of the subsequent stage, so that even when such relaxation exists, it does not influence the number of electrons $N_3$ of the upper level 3.

Here, as to the formation of the injection level in the first well layer of the emission layer 17 in the subband level structure described above, the emission layer 17 is preferably configured so that the wave function of the injection level 4 becomes maximum in the first well layer. Accordingly, in the first well layer which is on the most preceding stage side in the emission layer 17 and adjacent to the injection barrier, the injection level 4 can be preferably localized.

The injection level 4 to be formed in the first well layer is not necessarily localized only in the first well layer, and the injection level 4 may be formed across a plurality of well layers including the first well layer in the region on the injection layer 18a side of the preceding stage in the emission layer 17. This configuration is preferably properly set according to the number of well layers included in the emission layer 17, etc. Generally, in the emission layer 17, one or a plurality of well layers including at least the first well layer closest to the injection layer 18a of the preceding stage is used as a well layer for formation of the injection level.

In the embodiment described above, the upper level 3 and the lower level 2 are formed in the region on the injection layer 18 side of the same stage in the emission layer 17 with respect to the injection level 4, however, the configuration is not limited to this. Generally, by the configuration in which the first well layer closest to the injection layer 18a of the preceding stage in the emission layer 17 is used as a well layer for injection level formation, the effect of separation of the injection level 4 from the upper level 3 and lower level 2 in the emission layer 17 described above can be obtained.

Further, the electron injection layer 18 is preferably configured so that the well layer thicknesses of the plurality of well layers included in the injection layer monotonically decrease from the emission layer 17 side of the same stage toward the unit laminate structure side of the subsequent stage. Accordingly, injection of electrons into the injection level 4b in the emission layer 17b of the subsequent stage via the injection layer 18, such as the electron injection structure by the funnel injector, for example, described later, can be preferably realized.

In the quantum cascade laser 1A configured as described above, as shown in FIG. 2, the unit laminate structure 16 of the active layer 15 has a relaxation level 1 as an energy level lower than the lower level 2 in its level structure, and preferably, electrons after the intersubband transition are relaxed from the lower level 2 to the relaxation level 1, and then injected into the injection level in the unit laminate structure of the subsequent stage. According to the level structure of this 4-level system, emission operation in a cascading manner in the active layer 15 consisting of a plurality of unit laminate structures 16 can be preferably realized.

In the configuration having the relaxation level 1 as described above, in the unit laminate structure 16, electrons after the intersubband transition and at the lower level 2 are preferably relaxed to the relaxation level 1 by LO phonon scattering. Accordingly, electrons which transited to the lower level 2 are relaxed at a high speed to the relaxation level 1 by LO phonon scattering and a population inversion can be preferably formed between the level 3 and the level 2. Alternatively, electrons at the lower level 2 in the unit laminate structure 16 may be relaxed to the relaxation level 1 by relaxation in a miniband by a superlattice.

Concerning supply of elections from the injection level 4 to the upper level 3, it is preferable that in the unit laminate structure 16, electrons injected into the injection level 4 are supplied to the emission upper level 3 by LO phonon scattering. Accordingly, as described above with respect to FIG. 2, electrons injected from the level 1a of the unit laminate structure of the preceding stage into the injection level 4 can be supplied at a high speed to the emission upper level 3 via LO phonon scattering.

Figure 4:
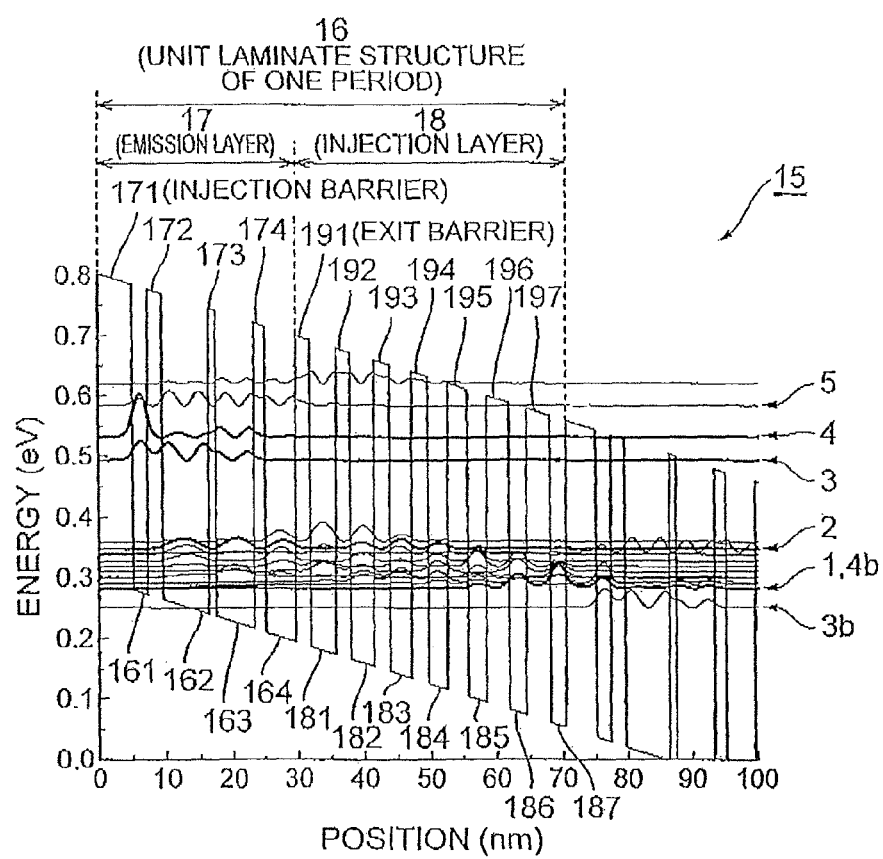
FIG. 4 is a diagram showing an example of a configuration of a unit laminate structure constituting the active layer.

The configuration of the quantum cascade laser of the present invention will be described in greater detail along with a specific example of the quantum well structure in the active layer. FIG. 4 is a diagram showing an example of a configuration of the unit laminate structure constituting the active layer. The quantum well structure of the active layer 15 in this configuration example shows an example designed by setting an oscillation wavelength of 8.5 μm, a corresponding emission transition energy of 146 meV, and an operation electric field of 32 kV/cm. In addition, in FIG. 4, a quantum well structure and a subband level structure of a part of the multistage repetitive structure of the emission layers 17 and the injection layers 18 constituting the active layer 15 are shown, The unit laminate structure 16 of one period constituting the active layer 15 is configured as a quantum well structure including eleven quantum well layers 161 to 164 and 181 to 187 and eleven quantum barrier layers 171 to 174 and 191 and 197 alternately laminated as shown in FIG. 4. Among these semiconductor layers, the quantum well layers are formed of $In_{0.53}Ga_{0.47}As$ layers. Moreover, the quantum barrier layers are formed of $In_{0.52}Al_{0.48}As$ layers. This InGaAs/AlInAs quantum well structure is a material system which is lattice-matched to an InP substrate.

In this unit laminate structure 16, the lamination portion consisting of the well layers 161 to 164 and the barrier layers 171 to 174 functions mainly as the emission layer 17. Moreover, the lamination portion consisting of the well layers 181 to 187 and the barrier layers 191 to 197 functions mainly as the injection layer 18. In addition, among the semiconductor layers of the emission layer 17, the barrier layer 171 of the first stage is an injection barrier layer. Similarly, among the semiconductor layers of the injection layer 18, the barrier layer 191 of the first stage is an exit barrier layer. Moreover, FIG. 5 shows an example of a detailed structure of the unit laminate structure 16 of one period in the active layer 15.

In this configuration, in the unit laminate structure 16, twelve levels are formed as subband levels contributing to laser operation. Moreover, a plurality of levels correspond to the emission lower level 2 and the relaxation level 1 of the levels 1 to 4 shown in FIG. 2. In FIG. 4, a level which substantially serves as an emission lower level is defined as a level 2, and a level which is on the lowest energy side in the injection layer 18 and resonant-tunnels to the injection level 4b of the subsequent stage is defined as a level 1. In addition, in the level structure shown in FIG. 4, as an electron extraction structure from the lower level 2 to the relaxation level 1, a relaxation structure by a miniband is used.

Procedures for designing the quantum well structure in the unit laminate structure 16 shown in FIG. 4 will be described. First, an energy interval between the upper level 3 and the lower level 2 for giving a laser oscillation wavelength, and an electron extraction structure on the lower level 2 side, are determined. The energy interval between the level 3 and the level 2 is determined according to the well widths of the well layers 161 to 164, the thicknesses of the barrier layers 172 to 174 in the emission layer 17, and an operation electric field. Moreover, the operation electric field is set based on an estimated film thickness of the laminate structure of one period and a voltage drop amount.

The well widths of the well layers 161 to 164 and the thicknesses of the barrier layers 172 to 174 which determine the emission wavelength in the active layer 15 cannot be determined independently because the wave function of each level is influenced sensitively by each well layer and barrier layer, and the well widths and the thicknesses are quantum-mechanically determined by using, for example, numerical calculations. Moreover, when the position of the injection level 4 is determined in the next design step, the emission wavelength changes again, so that the well layers 162, 163, and 164 and the barrier layers 173 and 174 are roughly determined here.

Herein, this design step is performed so that, simultaneously with determination of the upper level 3, the position of the level 5 on the higher energy side than the injection level 4 is also determined, and the injection level 4 is inserted between the upper level 3 and the level 5. Therefore, if the energy interval between the level 3 and the level 5 is excessively narrow at this time, electrons are directly injected into the level 5 from the level 1a (refer to FIG. 2) of the injection layer of the preceding stage, and the electron injection efficiency is reduced. Therefore, at the time of determination of the well layers 162, 163 and 164 and the barrier layers 173 and 174 as described above, the energy interval between the emission upper level 3 and the level 5 is preferably set to be wide. In the configuration example shown in FIG. 4, the energy interval between the level 3 and the level 5 is approximately 90 meV.

Next, a well width of the quantum well layer 161 for forming the injection level 4 which characterizes the quantum well structure in the active layer 15 of the present quantum cascade laser is determined. Concerning this well width, the ground level when the well layer 161 exists as a single well layer corresponds to the injection level 4, so that its well width inevitably becomes thinner than other well layers in the emission layer 17. However, as described above, the wave function of the level 4 must be localized in the well layer 161, so that the well width of the well layer 161 becomes thicker than in the conventional structures such as a 3QW structure, a double-phonon resonant structure, and a BTC structure.

The energy interval between the injection level 4 and the upper level 3 is preferably made equal to the LO phonon energy $E_{LO}$ as described above. In this case, by adjusting the thickness of the well layer 161, the level 4 is set at a position by the LO phonon energy higher than the upper level 3. Moreover, at this time, the thickness of the barrier layer 172 is also sufficiently examined so that the wave functions of the injection level 4 and the upper level 3 are properly coupled.

Specifically, if the barrier layer 172 is excessively thick, the wave function of the level 4 is completely localized in the well layer 161, and even if the energy interval between the level 3 and the level 4 is equal to LO phonon energy, the wave function coupling is small and a sufficiently rapid relaxation time $\tau_{43}$ from the level 4 to the level 3 cannot be obtained. On the other hand, if the barrier layer 172 is excessively thin, the coupling between the level 4 and the level 3 becomes excessively strong, and electron relaxation from the level 4 to the levels not higher than the lower level 2 increases, so that the electron injection efficiency into the level 3 is deteriorated. This must be considered in the setting of the thickness of the barrier layer 172.

In each design step described above, the designed emission wavelength and intervals between the levels etc., always change. Therefore, the layer structure is finely adjusted by considering these changes in each step, and as shown in FIG. 5, the thicknesses of the quantum well layers 161 to 164 and the barrier layers 172 to 174 in the emission layer 17 are finally determined.

Next, the layer structure of the electron injection layer 18 is designed. In the configuration example shown in FIG. 4, an electron transportation structure (refer to Patent Document 6: Japanese Patent Application Laid-Open No. H10-4242) called Funnel Injector is used in the injection layer 18. In the funnel injector, a miniband is used for relaxation and transportation of electrons in the injection layer. Then, by narrowing the energy width of the relaxation miniband toward the emission layer of the subsequent stage, the electron injection efficiency from the level 1 into the injection level 4b of the subsequent stage is improved. This level structure can be realized by a configuration in which the well layer thicknesses monotonically decrease from the emission layer 17 side of the same stage toward the unit laminate structure side of the subsequent stage in the injection layer 18. Moreover, in this case, it is preferable that the barrier layer thicknesses excluding the exit barrier monotonically increase from the emission layer 17 side of the same stage toward the unit laminate structure side of the subsequent stage in the injection layer 18.

Among the well layers 181 to 187 and the barrier layers 191 to 197 constituting the injection layer 18, the barrier layer 191 adjacent to the emission layer 17 is an exit barrier layer. If this exit barrier layer 191 is excessively thick, the flow of electrons from the emission layer 17 to the injection layer 18 is lost, however, if the exit barrier layer is excessively thin, strong coupling to the wave function in the emission layer 17 occurs and influences the flow, so that the design must be carefully performed while considering these.

The thicknesses of the well layers and the barrier layers on the exit barrier side in the injection layer 18 are set so that all electrons from levels in the emission layer 17 can be transported to a miniband in the injection layer 18. On the other hand, concerning the thicknesses of the well layers and the barrier layers on the emission layer side of the subsequent stage, the energy width of the miniband must be narrowed so that electrons are injected into only the injection level 4b of the subsequent stage and no electrons are injected into the level 5. Considering these, as shown in FIG. 5, the thicknesses of the quantum well layers 181 to 187 and the barrier layers 191 to 197 in the injection layer 18 are finally determined.

Finally, the thickness of the injection barrier layer 171 is determined. This barrier layer 171 determines the strengths of coupling of periods in the unit laminate structures 16 of the plurality of periods constituting the active layer 15, and a corresponding maximum current. Here, the strength of wave function coupling is determined according to an anticrossing gap. The anticrossing gap (anticrossing energy gap) indicates the degree of coupling of two well layers, and becomes zero when the thickness of a barrier layer between the well layers is infinite, and the anticrossing gap becomes larger (coupling becomes stronger) as the barrier layer becomes thinner. In the configuration example shown in FIG. 4, this anticrossing gap is set to $$2\hbar\Omega \sim 9.5 \text{ meV} \qquad [\text{Equation 2}]$$

and the design is made so that a sufficiently high current can be transported. Moreover, the thickness of the injection barrier layer 171 in this case is 4.5 nm.

In the subband level structure in the active layer 15 designed as described above, electron injection efficiency η from the injection level 4 to the upper level 3 will be considered. When $\tau_{43}$ is the relaxation time of electrons from the injection level 4 to the emission upper level 3 as described above and $\tau_{4low}$ is a total of relaxation times from the injection level 4 to all levels lower than the upper level 3, the injection efficiency η is expressed as follows.

$$\eta = (1/\tau_{43})/\{(1/\tau_{43}) + (1/\tau_{4low})\} \qquad [\text{Equation 3}]$$

In the configuration example shown in FIG. 4, the relaxation times are calculated as $\tau_{43} = 0.271$ psec and $\tau_{4low} = 2.94$ psec, and the electron injection efficiency is η=0.9155.

Figure 6:
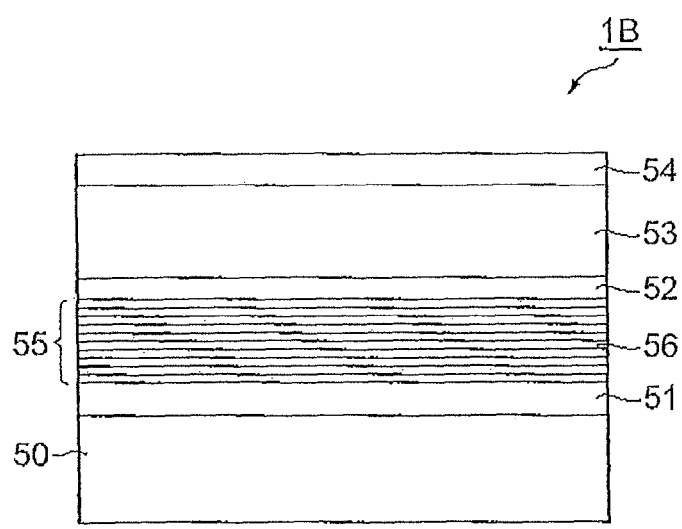
FIG. 6 is a sectional view showing an example of a semiconductor lamination structure of the quantum cascade laser.

A specific device structure of a quantum cascade laser including an active layer having the subband level structure shown in FIG. 2 will be described along with a detailed example thereof. FIG. 6 is a sectional view showing an example of a semiconductor lamination structure to be used in a quantum cascade laser. This device structure can be formed by crystal growth using, for example, a molecular beam epitaxy (MBE) method or a metal-organic vapor phase epitaxy (MOVPE) method.

In the semiconductor lamination structure of a quantum cascade laser 1B shown in FIG. 6, an n-type InP single crystal substrate 50 is used as a semiconductor substrate. Then, on this InP substrate 50, in order from the substrate side, an InGaAs lower core layer 51 with a thickness of 300 nm, an active layer 55 including multistage-laminated unit laminate structures 56, an InGaAs upper core layer 52 with a thickness of 300 nm, an InP cladding layer 53 with a thickness of 3.5 µm, and an InGaAs contact layer 54 with a thickness of 10 nm are laminated, and accordingly, a device structure of the quantum cascade laser 1B is formed. Moreover, in this lamination structure, the lower core layer 51, the upper core layer 52, the cladding layer 53, and the contact layer 54 except for the active layer 55 are lattice-matched to the InP substrate 50.

In this configuration example, the active layer 55 is configured by laminating the unit laminate structures 56 each including the emission layer and the injection layer in 33 periods. Moreover, for a detailed configuration of the unit laminate structure 56 of one period, for example, the quantum well structure shown in FIG. 4 and FIG. 5 in which eleven well layers and barrier layers are alternately laminated can be used. Among these semiconductor layers constituting the unit laminate structure 56 of the active layer 55, the quantum well layers are formed of InGaAs layers obtained by introducing +1% lattice mismatch (compressive strain) to the InP substrate 50. Moreover, the quantum barrier layers are formed of InAlAs layers obtained by introducing −1% lattice mismatch (tensile strain) to the InP substrate 50.

The unit laminate structure 56 and the active layer 55 have a strain compensating structure in which lattice strain is canceled as a whole by alternately laminating the above-described well layers and barrier layers. By this structure, a band offset $\Delta Ec$ of the conduction band can be made larger than in the case where the layers are lattice-matched to the substrate. In this case, an increase in the degree of freedom in element design, efficient carrier confinement, and a shorter oscillation wavelength is possible.

The quantum cascade laser of the present invention is not limited to the above-described embodiment and configuration example, and can be modified in many ways. For example, in the configuration example described above, an InP substrate is used as a semiconductor substrate, and the active layer is made of InGaAs/InAlAs, however, specifically, various configurations are possible as long as emission transition due to intersubband transition is possible in the quantum well structure and the above-described subband level structure can be realized.

As the semiconductor material system, in addition to InGaAs/InAlAs described above, various material systems such as GaAs/AlGaAs, InAs/AlSb, GaN/AlGaN, and SiGe/Si, etc., can be used. Moreover, various methods can be used as the semiconductor crystal growth method. In addition, as the semiconductor lamination structure as the entire laser device of the quantum cascade laser, various structures can be used in addition to the structure shown in FIG. 6. Generally, a quantum cascade laser is only required to include a semiconductor substrate and an active layer configured as described above and provided on the semiconductor substrate. Moreover, the present invention is applicable not only to the above-described example of a mid-infrared wavelength region but also to a terahertz (THz) region, for example.

Here, the quantum cascade laser of the above-described embodiment includes: (1) a semiconductor substrate, and (2) an active layer which is provided on the semiconductor substrate and has a cascade structure formed by alternately laminating quantum well emission layers and injection layers by multistage-laminating unit laminate structures each consisting of the quantum well emission layer and the injection layer, wherein (3) each of the plurality of unit laminate structures included in the active layer has an emission upper level, an emission lower level, and an injection level as an energy level higher than the emission upper level in its subband level structure, (4) light is generated by intersubband transition of electrons from the emission upper level into the emission lower level in the quantum well emission layer, and electrons after the intersubband transition are injected into the injection level in the unit laminate structure of the subsequent stage via the injection layer, and (5) the quantum well emission layer includes n (n is an integer of 2 or more) well layers, and a first well layer closest to the injection layer of the preceding stage is formed as a well layer for injection level formation.

In the above-described configuration, concerning formation of the injection level in the first well layer of the emission layer, it is preferable that the quantum well emission layer is configured so that the wave function of the injection level becomes maximum in the first well layer. Accordingly, the injection level can be preferably localized in the first well layer closest to the preceding stage in the emission layer.

The injection layer is preferably configured so that the well layer thicknesses of the plurality of well layers included in the injection layer monotonically decrease from the quantum well emission layer side of the same stage toward the unit laminate structure side of the subsequent stage. Accordingly, injection of electrons into the injection level of the subsequent stage via the injection layer can be preferably realized.

In the unit laminate structure constituting the active layer, electrons injected into the injection level are preferably supplied from the injection level to the emission upper level by longitudinal optical phonon scattering (LO phonon scattering). In this configuration, electrons injected into the injection level from the unit laminate structure of the preceding stage are supplied at a high speed to the emission upper level via LO (Longitudinal Optical) phonon scattering. Moreover, in this case, the energy difference between the injection level and the emission upper level is set according to LO phonon energy.

The unit laminate structure is preferably configured so that the electron relaxation time from the injection level to the emission upper level becomes shorter than the electron relaxation time from the emission upper level to the emission lower level. Accordingly, electrons can be preferably accumulated in the emission upper level during laser operation.

It is preferable that the unit laminate structure is configured so that the electron relaxation time from the injection level to the emission upper level becomes shorter than the electron relaxation time from the injection level to the emission lower level. Alternatively, further, the unit laminate structure is preferably configured so that the electron relaxation time from the injection level to the emission upper level becomes shorter than the electron relaxation time from the injection level to all levels lower than the emission upper level. Accordingly, an effective population inversion can be formed between the upper level and the lower level with high efficiency. Moreover, this relaxation time setting is preferably realized by a configuration in which the injection level is localized on the preceding stage side in the emission layer as described above.

Preferably, the unit laminate structure has a relaxation level as an energy level lower than the emission lower level in its subband level structure, and electrons after the intersubband transition are relaxed from the emission lower level to the relaxation level, and then injected into the injection level in the unit laminate structure of the subsequent stage. Thus, according to the level structure of the 4-level system including the relaxation level (level 1), the emission lower level (level 2), the emission upper level (level 3), and the injection level (level 4), emission operation in a cascade manner in the active layer consisting of a plurality of unit laminate structures can be preferably realized.

In this subband level structure, in the unit laminate structure, electrons after the intersubband transition are preferably relaxed from the emission lower level to the relaxation level by longitudinal optical phonon scattering. Alternatively, in the unit laminate structure, electrons after the intersubband transition are preferably relaxed from the emission lower level to the relaxation level by relaxation in a miniband.

INDUSTRIAL APPLICABILITY

The present invention is applicable as a quantum cascade laser capable of realizing operation with high efficiency at high temperatures.

The invention claimed is:

1. A quantum cascade laser comprising:
   a semiconductor substrate; and
   an active layer which is provided on the semiconductor substrate and has a cascade structure formed by alternately laminating quantum well emission layers and injection layers by multistage-laminating unit laminate structures each including the quantum well emission layer and the injection layer, wherein
   each of the plurality of unit laminate structures included in the active layer has an emission upper level, an emission lower level, and an injection level as an energy level higher than the emission upper level in its subband level structure,
   light is generated by intersubband transition of electrons from the emission upper level into the emission lower level in the quantum well emission layer, and electrons after the intersubband transition are injected into the injection level in the unit laminate structure of the subsequent stage via the injection layer, and
   the quantum well emission layer includes n, n is an integer of 2 or more, well layers, and a first well layer closest to the injection layer side of the preceding stage is formed as a well layer for formation of the injection level.

2. The quantum cascade laser according to claim 1, wherein the quantum well emission layer is configured so that the wave function of the injection level becomes maximum in the first well layer.

3. The quantum cascade laser according to claim 1, wherein the injection layer is configured so that the well layer thicknesses of the plurality of well layers included in the injection layer monotonically decrease from the quantum well emission layer side of the same stage toward the unit laminate structure side of the subsequent stage.

4. The quantum cascade laser according to claim 1, wherein in the unit laminate structure, electrons injected into the injection level are supplied from the injection level to the emission upper level by longitudinal optical phonon scattering.

5. The quantum cascade laser according to claim 1, wherein the unit laminate structure is configured so that the electron relaxation time from the injection level to the emission upper level becomes shorter than the electron relaxation time from the emission upper level to the emission lower level.

6. The quantum cascade laser according to claim 1, wherein the unit laminate structure is configured so that the electron relaxation time from the injection level to the emission upper level becomes shorter than the electron relaxation time from the injection level to all levels lower than the emission upper level.

7. The quantum cascade laser according to claim 1, wherein
   the unit laminate structure has a relaxation level as an energy level lower than the emission lower level in its subband level structure, and
   electrons after the intersubband transition are relaxed from the emission lower level to the relaxation level, and then injected into the injection level in the unit laminate structure of the subsequent stage.

8. The quantum cascade laser according to claim 7, wherein in the unit laminate structure, electrons after the intersubband transition are relaxed from the emission lower level to the relaxation level by longitudinal optical phonon scattering.

9. The quantum cascade laser according to claim 7, wherein in the unit laminate structure, electrons after the intersubband transition are relaxed from the emission lower level to the relaxation level by relaxation in a miniband.

* * * * *

UNITED STATES PATENT AND TRADEMARK OFFICE
CERTIFICATE OF CORRECTION

PATENT NO.        : 8,374,208 B2                                                Page 1 of 1
APPLICATION NO.   : 12/919289
DATED             : February 12, 2013
INVENTOR(S)       : Yamanishi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 25 days.

Signed and Sealed this
First Day of September, 2015

Michelle K. Lee
*Director of the United States Patent and Trademark Office*